United States Patent
Wu et al.

[19]

[11] Patent Number: 5,994,945
[45] Date of Patent: Nov. 30, 1999

[54] CIRCUIT FOR COMPENSATING FOR VARIATIONS IN BOTH TEMPERATURE AND SUPPLY VOLTAGE

[75] Inventors: Chau-Chin Wu; Ta-Ke Tien, both of Cupertino; Kuo-Huei Yen, San Jose, all of Calif.

[73] Assignee: Integrated Device Technology, Inc., Santa Clara, Calif.

[21] Appl. No.: 09/040,329

[22] Filed: Mar. 16, 1998

[51] Int. Cl.[6] .................................................. H03K 17/14
[52] U.S. Cl. ...................... 327/378; 327/362; 327/538; 327/513; 330/289
[58] Field of Search .................................... 327/513, 530, 327/538, 512, 542, 543, 541, 362, 378; 323/312, 313, 315; 330/256, 289

[56] References Cited

U.S. PATENT DOCUMENTS 5,631,600  5/1997  Akioka et al. ............................ 327/543

*Primary Examiner*—Kenneth B. Wells
*Assistant Examiner*—Minh Nguyen
*Attorney, Agent, or Firm*—Bever & Hoffman

[57] ABSTRACT

A compensation circuit which accounts for variations in both temperature and $V_{CC}$ supply voltage on an integrated circuit. The compensation circuit includes four quasi-independent compensation current sources, each of which generates a corresponding compensation current. The first compensation current source generates a first compensation current which has a positive slope with respect to temperature. The second compensation current source generates a second compensation current which has a negative slope with respect to temperature. The third compensation current source generates a third compensation current which has a negative slope with respect to the $V_{CC}$ supply voltage. The fourth compensation current source generates a fourth compensation current which has a positive slope with respect to the $V_{CC}$ supply voltage. The first, second, third and fourth compensation currents are summed to create a total compensation current. The compensation current sources are designed to provide different, pre-determined total compensation currents for different temperatures and supply voltages. The predetermined total compensation currents are selected to cause the compensated circuit to transfer signals at a constant speed, regardless of temperature and supply voltage.

19 Claims, 9 Drawing Sheets

CIRCUIT FOR COMPENSATING FOR VARIATIONS IN BOTH TEMPERATURE AND SUPPLY VOLTAGE

BACKGROUND OF THE INVENTION

1. Field of the Invention

The present invention relates to a compensation circuit which compensates for variations in both temperature and supply voltage of an integrated circuit. More specifically, the present invention relates to a compensation circuit which ensures that predetermined currents are routed through a compensated circuit when the compensated circuit is operated with pre-defined ranges of temperature and supply voltage.

2. Discussion of Related Art

FIG. 1 is a schematic diagram of a CMOS inverter 100 which includes p-channel field effect transistor (FET) 101, n-channel FET 102, input terminal 103 and output terminal 104. P-channel FET 101 and n-channel FET 102 are connected in series between the $V_{CC}$ voltage supply terminal and the ground voltage supply terminal as illustrated. When the signal (IN) applied to input terminal 103 has a logic high value (i.e., $V_{CC}$), n-channel FET 102 is turned on, and p-channel FET 101 is turned off. At this time, a current $I_{N102}$ flows between output terminal 104 and the ground voltage supply terminal. When the IN signal applied to input terminal 103 has a logic low value (i.e., 0 volts), p-channel FET 101 is turned on, and n-channel FET 102 is turned off. At this time, a current $I_{P101}$ flows between the $V_{CC}$ voltage supply terminal and output terminal 104.

Inverter 100 is typically fabricated on a semiconductor chip. On the chip, the temperature and $V_{CC}$ supply voltage can vary. For example, a $V_{CC}$ voltage supply having a specified voltage of 3.3 Volts may vary from a low of 2.8 Volts to a high of 3.8 Volts. As the temperature and $V_{CC}$ supply voltage vary, the intrinsic resistances and capacitances of FETs 101 and 102 will vary. The variations in resistance and capacitance, in turn, cause the currents $I_{P101}$ and $I_{N102}$ to vary. Moreover, the variations in resistance and capacitance undesirably result in variations in the speed of signal propagation through inverter 100 and/or variations in the gain of inverter 100. As a result, inverter 100 typically only meets the design specifications for a very narrow range of temperatures and $V_{CC}$ supply voltages. This is unacceptable in high performance circuits.

A first class of circuits has been provided to compensate for current variations that result from variations in temperature. A second class of circuits has been provided to compensate for current variations that result from variations in the $V_{CC}$ supply voltage. However, none of these circuits are capable of simultaneously compensating for current variations that result from both variations in temperature and variations in the $V_{CC}$ supply voltage.

It would therefore be desirable to have a circuit that compensates for current variations which result from both variations in temperature and variations in the $V_{CC}$ supply voltage.

SUMMARY

Accordingly, the present invention provides a compensation circuit which accounts for variations in both temperature and $V_{CC}$ supply voltage on an integrated circuit. The compensation circuit includes four quasi-independent compensation current sources, each of which generates a corresponding compensation current. The first compensation current source generates a first compensation current that has a positive slope with respect to temperature. The second compensation current source generates a second compensation current that has a negative slope with respect to temperature. The third compensation current source generates a third compensation current that has a negative slope with respect to the $V_{CC}$ supply voltage. The fourth compensation current source generates a fourth compensation current that has a positive slope with respect to the $V_{CC}$ supply voltage. The first, second, third and fourth compensation currents are summed by a summing circuit to create a total compensation current. The total compensation current is translated to the circuit to be compensated, using, for example, a current mirror circuit.

The total compensation current, which has predetermined values for predetermined temperatures and supply voltages, is selected in view of the desired operating characteristics of the circuit to be compensated. More specifically, the total compensation current is selected to maintain a desired speed of signal propagation through the compensated circuit, regardless of the temperature or supply voltage. The four compensation currents are weighted to provide the desired total compensation current. In one embodiment, the compensation currents are weighted by adjusting current mirror circuits within the first, second, third and fourth compensation current sources.

In one embodiment, a current compensation circuit in accordance with the present invention is coupled to an inverter circuit, thereby controlling the charging and discharging currents of the inverter. As a result, the speed of signal propagation through the inverter is maintained at a desired, pre-determined level, regardless of the temperature or the supply voltage. In other embodiments, the current compensation circuit can be used to compensate other circuits, such as clock circuits, input/output buffer circuits, sense amplifiers or operational amplifiers. In yet other embodiments, the current compensation circuit can be used to over-compensate selected circuit elements within a larger circuit, thereby compensating the larger circuit.

The present invention will be more fully understood in view of the following description and drawings.

DETAILED DESCRIPTION

Figure 1:
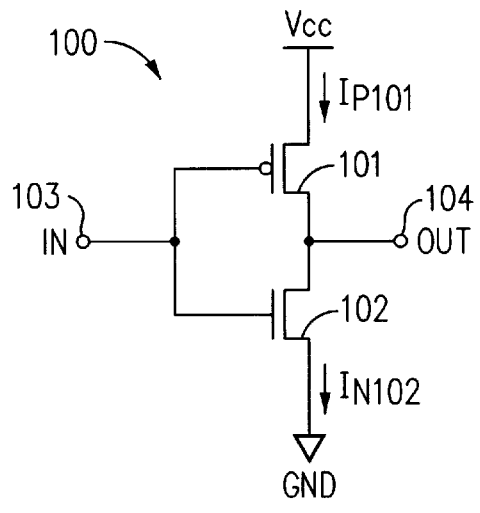
FIG. 1 is a circuit diagram of a conventional uncompensated CMOS inverter.
Figure 2:
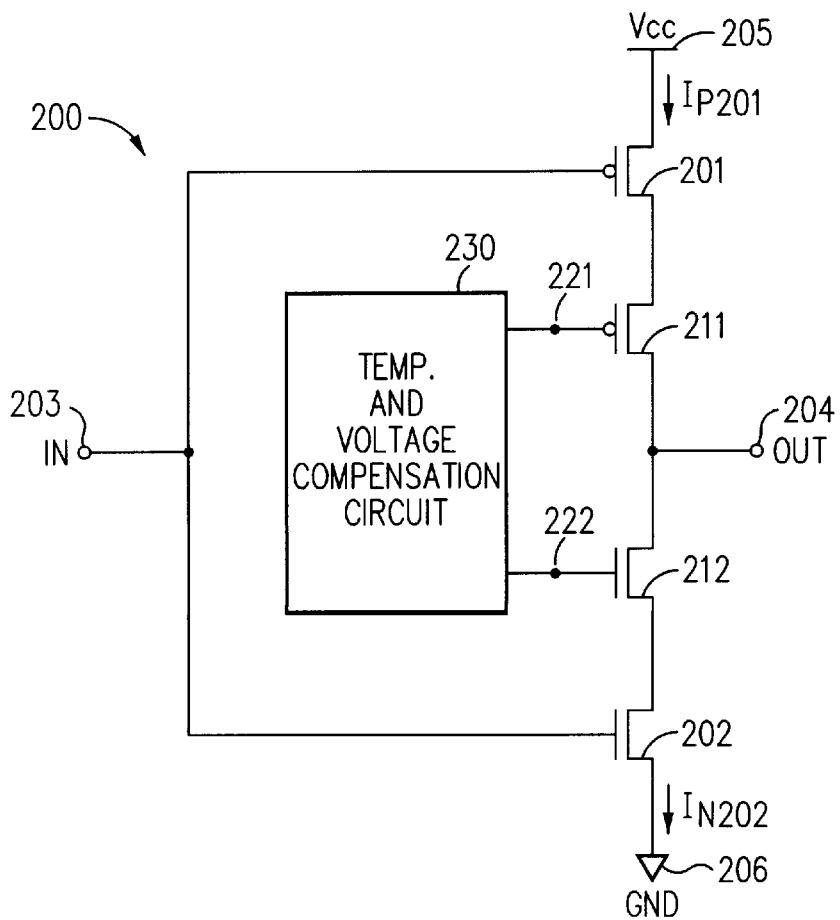
FIG. 2 is a circuit diagram of a compensated inverter in accordance with one embodiment of the present invention.

FIG. 2 is a circuit diagram of a compensated inverter 200 in accordance with one embodiment of the present invention. Compensated inverter 200 includes p-channel FETs 201 and 211, n-channel FETs 202 and 212, input terminal 203, output terminal 204, $V_{CC}$ voltage supply terminal 205, ground voltage supply terminal 206, control terminals 221–222 and temperature and voltage compensation circuit 230. P-channel FETs 201 and 211 are connected in series between $V_{CC}$ voltage supply terminal 205 and output terminal 204. The gate of p-channel FET 201 is coupled to input terminal 203, and the gate of p-channel FET 211 is coupled to compensation circuit 230 at control terminal 221. N-channel FETs 202 and 212 are connected in series between ground voltage supply terminal 206 and output terminal 204. The gate of n-channel FET 202 is coupled to input terminal 203, and the gate of n-channel FET 212 is coupled to compensation circuit 230 at control terminal 222.

In the examples described below, the $V_{CC}$ voltage supply terminal 205 has a specified voltage of 3.3 Volts. However, the actual $V_{CC}$ supply voltage provided at $V_{CC}$ voltage supply terminal 205 can vary within the range of 2.8 Volts and 3.8 Volts. These voltages are used for purposes of illustration. It is understood that the present invention can be applied to other circuits having different specified $V_{CC}$ supply voltages and $V_{CC}$ supply voltage ranges. Moreover, the examples described below assume that compensating inverter 200 operates within a temperature range of 0° C. to 90° C. This temperature range is illustrative, but not limiting. It is understood that compensating inverter 200 can be designed to operate within other temperature ranges.

In general, p-channel FET 201 and n-channel FET 202 are coupled as an inverter circuit, with compensation circuit 230, p-channel FET 211 and n-channel FET 212 ensuring that predetermined currents flow through this inverter circuit, so long as the temperature and the $V_{CC}$ supply voltage are within the defined ranges. These predetermined compensation currents are selected to maintain a constant speed of signal propagation through the inverter circuit, as long as the temperature and the $V_{CC}$ supply voltage are within the defined ranges. The speed of signal propagation is inversely related to temperature and $V_{CC}$ supply voltage. That is, without compensation, the speed of signal propagation decreases as the temperature increases (because the capacitance and resistance of the inverter circuit increase with an increase in temperature). Similarly, without compensation, the speed of signal propagation decreases as the $V_{CC}$ supply voltage increases (because the capacitance and resistance of the inverter circuit increase with an increase in $V_{CC}$ supply voltage). As a result, the predetermined compensation currents are typically selected to be higher at high temperatures and high $V_{CC}$ supply voltages, and lower at low temperatures and low $V_{CC}$ supply voltages. Although compensation circuit 230 provides compensation currents for an inverter circuit in the described example, it is understood that compensation circuit 230 can similarly provide compensation currents for other circuits where maintaining a constant speed or timing is significantly important, such as clock circuits, input/output buffer circuits, sense amplifiers and operational amplifiers.

In general, compensated inverter 200 operates as follows. When the input signal (IN) applied to input terminal 203 has a logic low value (e.g., 0 Volts), p-channel FET 201 is turned on (i.e., conducting), and n-channel FET 202 is turned off (i.e., non-conducting). When p-channel FET 201 is turned on, a current $I_{P201}$ flows from $V_{CC}$ supply voltage terminal 205 to output terminal 204 through p-channel FETs 201 and 211. Compensation circuit 230 controls p-channel FET 211 such that the current $I_{P201}$ has a value which has been pre-determined for the particular temperature and $V_{CC}$ supply voltage. As a result, a desired speed of signal propagation is maintained through the inverter circuit.

In the described example, the current $I_{P201}$ is selected to have predetermined values: (1) under low $V_{CC}$ supply voltage, low temperature (LVLT) conditions; (2) under low $V_{CC}$ supply voltage, high temperature (LVHT) conditions; (3) under high $V_{CC}$ supply voltage, low temperature (HVLT) conditions; and (4) under high $V_{CC}$ supply voltage, high temperature (HTHV) conditions. These four conditions are defined below in Table 1.

TABLE 1

|  | LVLT | LVHT | HVLT | HVHT |
| --- | --- | --- | --- | --- |
| VOLTAGE | 2.8 V | 2.8 V | 3.8 V | 3.8 V |
| TEMPERATURE | 0° C. | 90° C. | 0° C. | 90° C. |

The pre-determined values of the current $I_{P201}$ under the LVLT, LVHT, HVLT and HVHT conditions are identified as the $I_{LVLT}$, $I_{LVHT}$, $I_{HVLT}$ and $I_{HVHT}$ target currents, respectively. These pre-determined target current values are selected by the circuit designer, with a view towards the required operating characteristics of compensated inverter 200. In general, larger pre-determined current values result in a faster inverter circuit. In the described example, the pre-determined target current values are selected as set forth below in Table 2. Other predetermined target current values can be selected in other embodiments.

TABLE 2

| $I_{LVLT}$ | $I_{LVHT}$ | $I_{HVLT}$ | $I_{HVHT}$ |
| --- | --- | --- | --- |
| 260 µA | 348 µA | 316 µA | 415 µA |

The target current values listed in Table 2 are selected to provide a predetermined speed of signal propagation through the compensated inverter circuit 200 under the four defined operating conditions. Thus, the speed of signal propagation through compensated inverter circuit 200 (i.e., the signal propagation delay) will have substantially the same value if $I_{P201}$ is 260 µA under LVLT conditions, $I_{P201}$ is 348 µA under LVHT conditions, $I_{P201}$ is 316 µA under HVLT conditions, or $I_{P201}$ is 415 µA under HVHT conditions.

When the input signal (IN) applied to input terminal 203 has a logic high value (e.g., $V_{CC}$ Volts), n-channel FET 202 is turned on (i.e., conducting), and p-channel FET 201 is turned off (i.e., non-conducting). Compensation circuit 230 controls n-channel FET 212 to ensure that the current $I_{N202}$ flowing from output terminal 204 to ground supply voltage terminal 206 to through n-channel FETs 212 and 202 is equal to the pre-determined target currents $I_{LVLT}$, $I_{LVHT}$, $I_{HVLT}$ and $I_{HVHT}$ under the LVLT, LVHT, HVLT and HVHT conditions, respectively. The current $I_{N202}$ is substantially equal to the current $I_{P201}$ under similar operating conditions.

Although compensation circuit 230 is illustrated as being part of a single compensated inverter circuit 200, it is understood that an integrated circuit chip will typically include a single compensation circuit 230, which provides compensation to many inverter circuits. Thus, control terminals 221 and 222 may be connected to control many other inverter circuits (not shown) in addition to inverter circuit 200.

Figure 3:
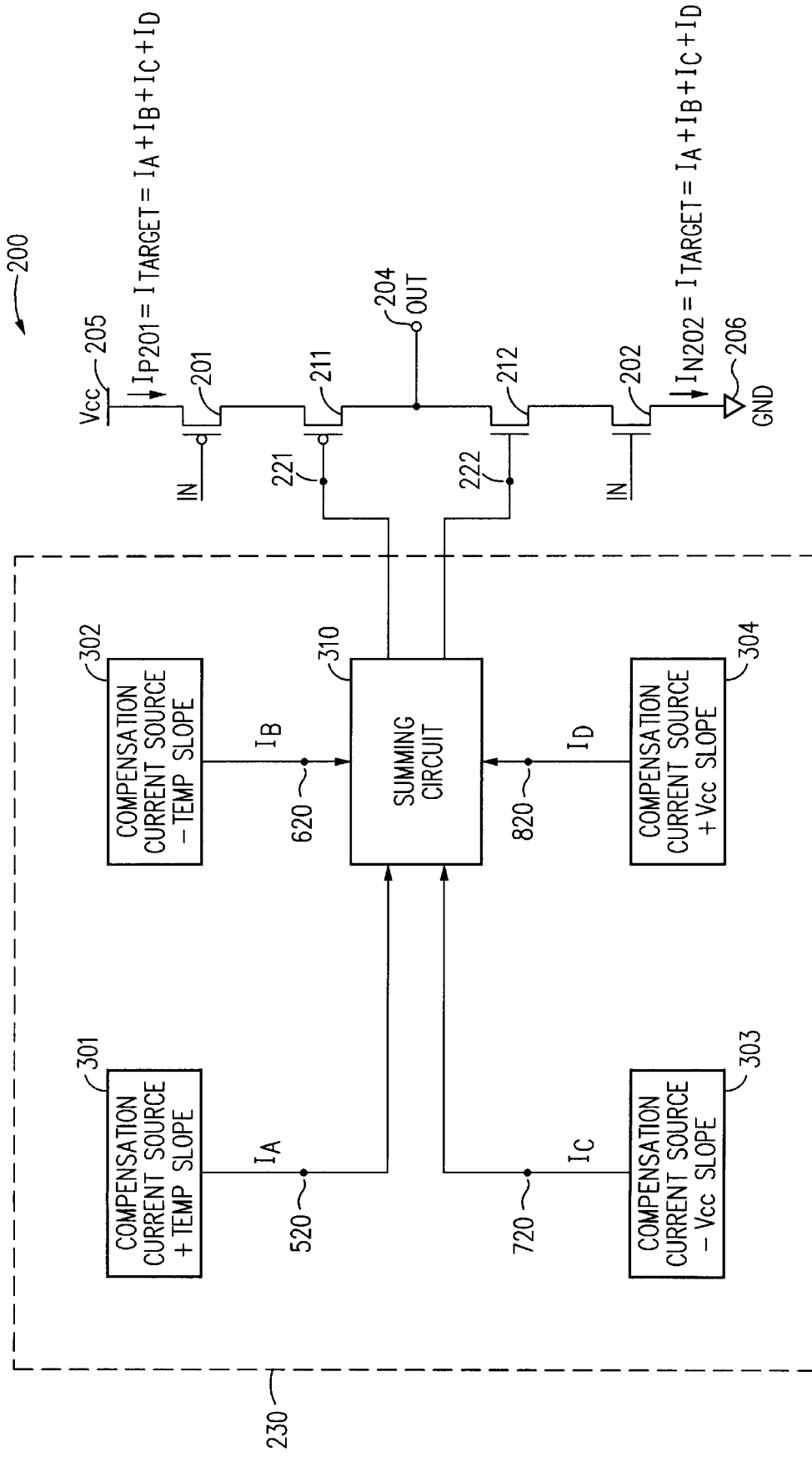
FIG. 3 is a circuit diagram which illustrates the compensated inverter of FIG. 2 in more detail.

FIG. 3 is a circuit diagram of compensated inverter circuit 200 which shows compensation circuit 230 in more detail. As illustrated in FIG. 3, compensation circuit 230 includes four quasi-independent compensating current sources 301–304 and a summing circuit 310. In general, current sources 301, 302, 303 and 304 generate compensation currents $I_A$, $I_B$, $I_C$ and $I_D$, respectively. These compensation currents $I_A$, $I_B$, $I_C$ and $I_D$ are added within summing circuit 310, thereby creating a total compensation current $I_{target}$. As described in more detail below, the total compensation current $I_{target}$ is translated as the $I_{P201}$ and $I_{N202}$ currents.

Figure 4A:
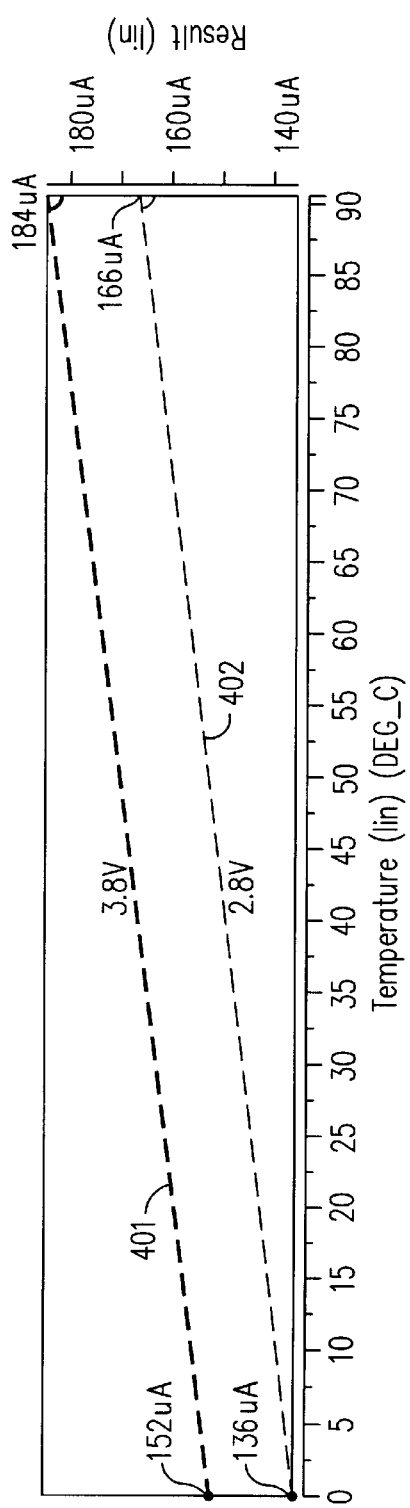
FIG. 4A is a graph illustrating a control current $I_A$ having a positive slope with respect to temperature, which is generated by one of the four quasi-independent compensating current sources.

Each of the quasi-independent compensation current sources 301–304 generates a compensation current which has a different response to either temperature or $V_{CC}$ supply voltage. Thus, compensation current source 301 generates a compensation current $I_A$ which is directly proportional to temperature, and which is relatively insensitive to the $V_{CC}$ supply voltage. FIG. 4A is a graph illustrating the variation of compensation current $I_A$ in response to variations in temperature and the $V_{CC}$ supply voltage. As illustrated by line 401 in FIG. 4A, compensation current source 301 generates a compensation current $I_A$ of 152 µA when the temperature is 0° C. and the $V_{CC}$ supply voltage is 3.8 Volts. When the temperature increases to 90° C. (and the $V_{CC}$ supply voltage remains at 3.8 Volts), compensation current source 301 generates a compensation current $I_A$ of 184 µA. Thus, the compensation current $I_A$ has a positive slope with respect to temperature. Stated another way, when the temperature increases, the compensation current $I_A$ increases, and when the temperature decreases, the compensation current $I_A$ decreases.

As illustrated by line 402 in FIG. 4A, compensation current source 301 generates a compensation current $I_A$ of 136 µA when the temperature is 0° C. and the $V_{CC}$ supply voltage is 2.8 Volts. Compensation current source 301 generates a compensation current $I_A$ of 166 µA when the temperature is 90° C. and the $V_{CC}$ supply voltage is 2.8 Volts. Thus, compensation current source 301 generates a compensation current $I_A$ that maintains a positive slope with respect to temperature, even when the $V_{CC}$ supply voltage varies across the full range of operation. Note that the compensation current $I_A$ is relatively insensitive to variations in the $V_{CC}$ supply voltage.

Figure 4B:
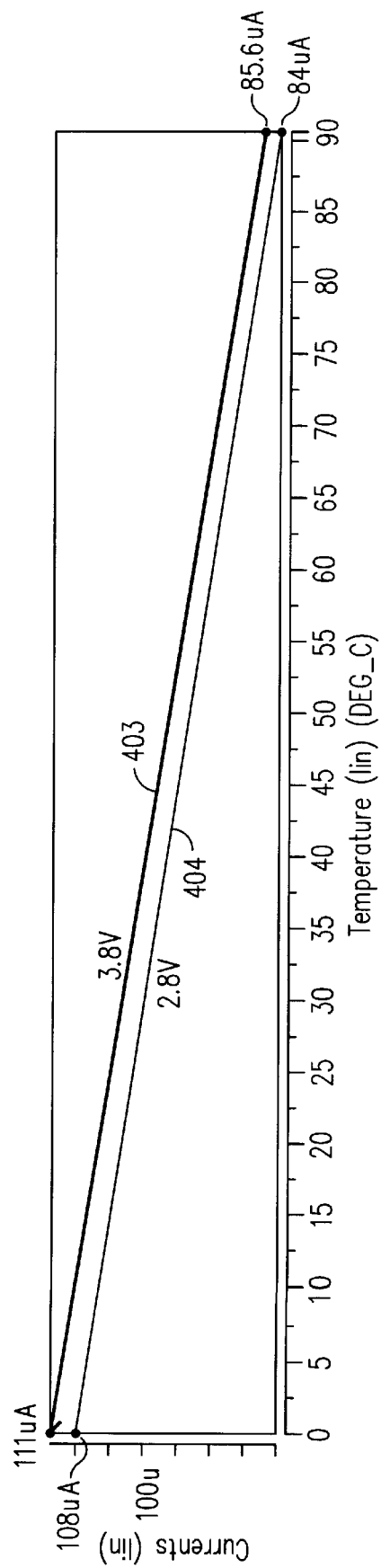
FIG. 4B is a graph illustrating a control current $I_B$ having a negative slope with respect to temperature, which is generated by one of the four quasi-independent compensating current sources.

Compensation current source 302 generates a compensation current $I_B$ which is inversely proportional to temperature, and which is relatively insensitive to variations in the $V_{CC}$ supply voltage. FIG. 4B is a graph illustrating the variation of compensation current $I_B$ in response to variations in temperature and the $V_{CC}$ supply voltage. As illustrated by line 403 in FIG. 4B, compensation current source 302 generates a compensation current $I_B$ of 111 µA when the temperature is 0° C. and the $V_{CC}$ supply voltage is 3.8 Volts. When the temperature increases to 90° C. (and the $V_{CC}$ supply voltage remains at 3.8 Volts), compensation current source 302 generates a compensation current $I_B$ of 85.6 µA. Thus, the compensation current $I_B$ has a negative slope with respect to temperature. Stated another way, when the temperature increases, the compensation current $I_B$ decreases, and when the temperature decreases, the compensation current $I_B$ increases.

As illustrated by line 404 in FIG. 4B, compensation current source 302 generates a compensation current $I_B$ of 108 µA when the temperature is 0° C. and the $V_{CC}$ supply voltage is 2.8 Volts. Compensation current source 302 generates a compensation current $I_B$ of 84 µA when the temperature is 90° C. and the $V_{CC}$ supply voltage is 2.8 Volts. Thus, compensation current source 302 generates a compensation current $I_B$ that exhibits a negative slope with respect to temperature, even when the $V_{CC}$ supply voltage varies across the full range of operation. Note that the compensation current $I_B$ is relatively insensitive to variations in the $V_{CC}$ supply voltage.

Figure 4C:
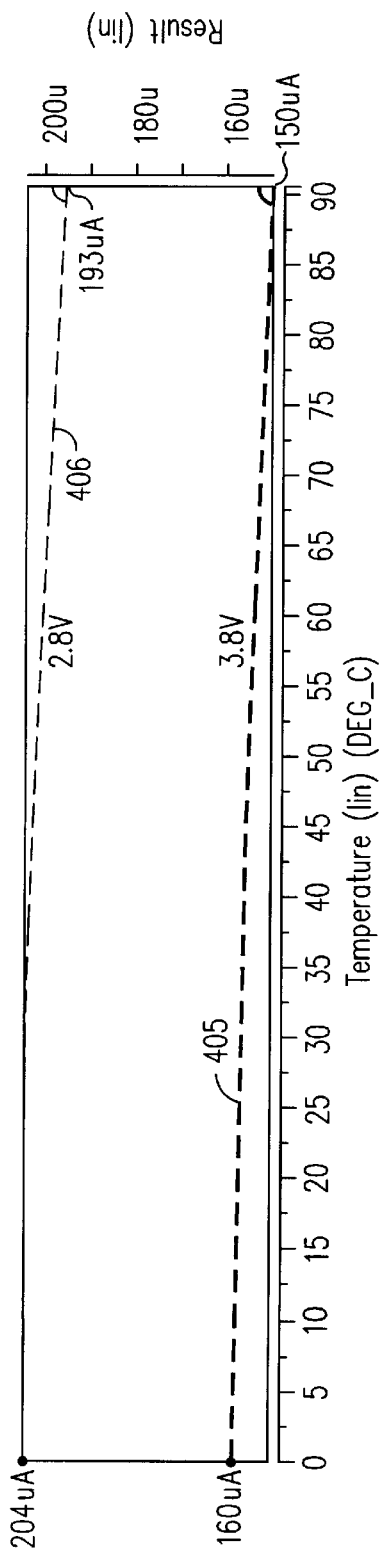
FIG. 4C is a graph illustrating a control current $I_C$ having a negative slope with respect to the $V_{CC}$ supply voltage, which is generated by one of the four quasi-independent compensating current sources.

Compensation current source 303 generates a compensation current $I_C$ which is inversely proportional to the $V_{CC}$ supply voltage, and which is relatively insensitive to variations in temperature. FIG. 4C is a graph illustrating the variation of compensation current $I_C$ in response to variations in temperature and the $V_{CC}$ supply voltage. As illustrated by line 405 in FIG. 4C, compensation current source 303 generates a compensation current $I_C$ of 160 µA when the temperature is 0° C. and the $V_{CC}$ supply voltage is 3.8 Volts. When the temperature increases to 90° C. (and the $V_{CC}$ supply voltage remains at 3.8 Volts), compensation current source 303 generates a compensation current $I_C$ of 150 µA. Thus, the compensation current $I_C$ is relatively insensitive to changes in temperature.

As illustrated by line 406 in FIG. 4C, compensation current source 303 generates a compensation current $I_C$ of 204 µA when the temperature is 0° C. and the $V_{CC}$ supply voltage is 2.8 Volts. Compensation current source 303 generates a compensation current $I_C$ of 193 µA when the temperature is 90° C. and the $V_{CC}$ supply voltage is 2.8 Volts. Thus, compensation current source 303 generates a compensation current $I_C$ that is inversely proportional to the $V_{CC}$ supply voltage. That is, when the $V_{CC}$ supply voltage increases, the compensation current $I_C$ decreases, and when the $V_{CC}$ supply voltage decreases, the compensation current $I_C$ increases. Stated another way, the compensation current $I_C$ exhibits a negative slope with respect to the $V_{CC}$ supply voltage, even when the temperature varies across the full range. Note that the compensation current $I_C$ is relatively insensitive to variations in temperature.

Figure 4D:
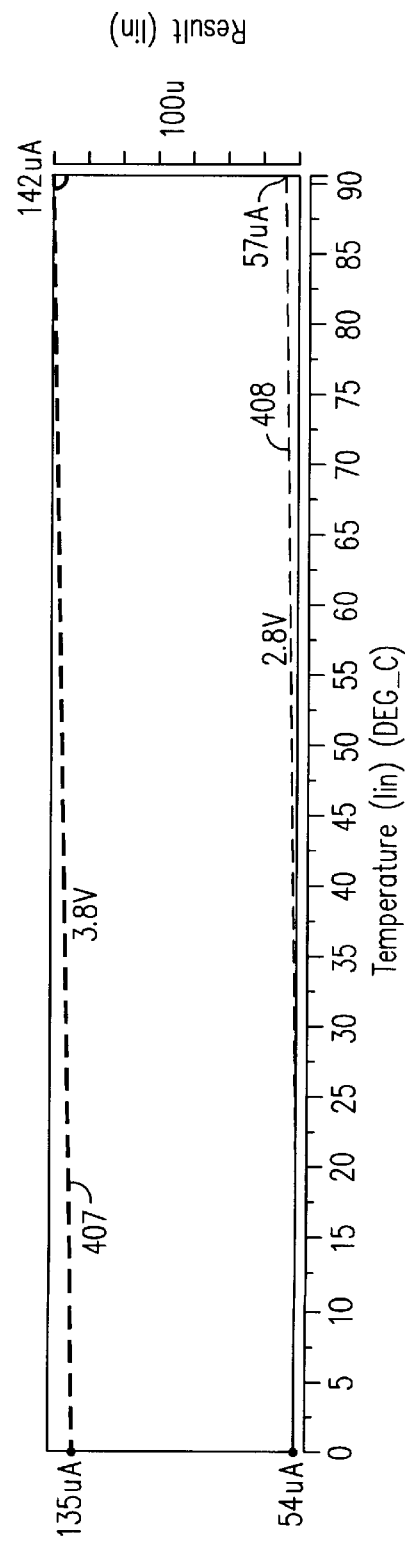
FIG. 4D is a graph illustrating a control current $I_C$ having a positive slope with respect to the $V_{CC}$ supply voltage, which is generated by one of the four quasi-independent compensating current sources.

Compensating current source 304 generates a compensation current $I_D$ which is directly proportional to the $V_{CC}$ supply voltage, and which is relatively insensitive to variations in temperature. FIG. 4D is a graph illustrating the variation of compensation current $I_D$ in response to variations in temperature and the $V_{CC}$ supply voltage. As illustrated by line 407 in FIG. 4D, compensation current source 304 generates a compensation current $I_D$ of 135 µA when the temperature is 0° C. and the $V_{CC}$ supply voltage is 3.8 Volts. When the temperature increases to 90° C. (and the $V_{CC}$ supply voltage remains at 3.8 Volts), compensation current source 304 generates a compensation current $I_D$ of 141 μA. Thus, the compensation current $I_D$ is relatively insensitive to changes in temperature.

As illustrated by line 408 in FIG. 4D, compensation current source 304 generates a control current $I_D$ of 54 μA when the temperature is 0° C. and the $V_{CC}$ supply voltage is 2.8 Volts. Compensation current source 304 generates a compensation current $I_D$ of 57 μA when the temperature is 90° C. and the $V_{CC}$ supply voltage is 2.8 Volts. Thus, compensation current source 304 generates a compensation current $I_D$ that is directly proportional to the $V_{CC}$ supply voltage. That is, when the $V_{CC}$ supply voltage increases, the compensation current $I_D$ increases, and when the $V_{CC}$ supply voltage decreases, the compensation current $I_D$ decreases. Stated another way, the compensation current $I_D$ exhibits a positive slope with respect to the $V_{CC}$ supply voltage, even when the temperature varies across the full range. Note that the compensation current $I_D$ is relatively insensitive to variations in temperature.

In order to assure that the specified compensation current $I_{target}$ is equal to the predetermined $I_{LVLT}$, $I_{LVHT}$, $I_{HVLT}$ and $I_{HVHT}$ currents for the LVLT, LVHT, HVLT and HVHT conditions, the compensation currents $I_A$, $I_B$, $I_C$ and $I_D$ provided by compensation current sources 301–304 must be weighted according the following equation.

$$[A][X]=[I] \quad (1)$$

where [I] is a current vector representing the specified compensation current $I_{target}$ under the LVLT, LVHT, HVLT and HVHT conditions, [A] is a current vector representing the compensating currents $I_A$, $I_B$, $I_C$ and $I_D$ under the LVLT, LVHT, HVLT and HVHT conditions, and [X] is a vector representing the relative weighting (ratio) of the compensating currents. Equation (1) can be re-written as follows.

$$\begin{pmatrix} I_{AHVLT} & I_{BHVLT} & I_{CHVLT} & I_{DHVLT} \\ I_{AHVHT} & I_{BHVHT} & I_{CHVHT} & I_{DHVHT} \\ I_{ALVLT} & I_{BLVLT} & I_{CLVLT} & I_{DLVHT} \\ I_{ALVHT} & I_{BLVHT} & I_{CLVHT} & I_{DLVHT} \end{pmatrix} \times \begin{pmatrix} X_A \\ X_B \\ X_C \\ X_D \end{pmatrix} = \begin{pmatrix} I_{HVLT} \\ I_{HVHT} \\ I_{LVLT} \\ I_{LVHT} \end{pmatrix} \quad (2)$$

Substituting the previously enumerated compensation current values in the [A] and [I] vectors yields the following.

$$\begin{pmatrix} 152\,\mu A & 111\,\mu A & 160\,\mu A & 135\,\mu A \\ 184\,\mu A & 86\,\mu A & 150\,\mu A & 142\,\mu A \\ 136\,\mu A & 108\,\mu A & 204\,\mu A & 54\,\mu A \\ 166\,\mu A & 84\,\mu A & 193\,\mu A & 57\,\mu A \end{pmatrix} \times \begin{pmatrix} X_A \\ X_B \\ X_C \\ X_D \end{pmatrix} = \begin{pmatrix} 316\,\mu A \\ 415\,\mu A \\ 260\,\mu A \\ 348\,\mu A \end{pmatrix} \quad (3)$$

Equation (3) can be expanded to create the four following equations.

$$152\,X_A + 111\,X_B + 160\,X_C + 135\,X_D = 316\,\mu A \quad (4)$$

$$184\,X_A + 86\,X_B + 150\,X_C + 142\,X_D = 415\,\mu A \quad (5)$$

$$136\,X_A + 108\,X_B + 204\,X_C + 54\,X_D = 260\,\mu A \quad (6)$$

$$166\,X_A + 84\,X_B + 193\,X_C + 57\,X_D = 348\,\mu A \quad (7)$$

There are therefore four equations (4)–(7) and four unknown values $X_A$–$X_D$. The four unknown values $X_A$–$X_D$ can be determined by conventional algebraic methods. In the present example, $X_A$ is equal to about 1.4, $X_B$ is equal to about −2.2, $X_C$ is equal to about 1.2 and $X_D$ is equal to about 1.5. The values $X_A$–$X_D$ represent the weighting (ratios) which must be applied the compensating current sources 301–304 in order to provide the desired total compensation current $I_{target}$. As described in more detail below, circuitry within compensating current sources 301–304 can be modified to allow the selection of values $X_A$–$X_D$.

Selecting the values $X_A$–$X_D$ as described above ensures that the desired compensation currents $I_{LVLT}$, $I_{LVHT}$, $I_{HVLT}$ and $I_{HVHT}$ are is generated under the LVLT, LVHT, HVLT and HVHT conditions, respectively. Because the compensation currents $I_A$, $I_B$, $I_C$ and $I_D$ generated by compensation current circuits 301–304 each vary in a linear manner (See, FIGS. 4A–4D), the desired compensation current $I_{target}$ is generated for all operating conditions within the above-defined temperatures and $V_{CC}$ supply voltages.

Although the above-described example uses four compensation current sources, it is understood that other numbers of compensation current sources can be used in other embodiments.

Compensation current sources 301–304 and summing circuit 310 will now be described in detail.

Figure 5:
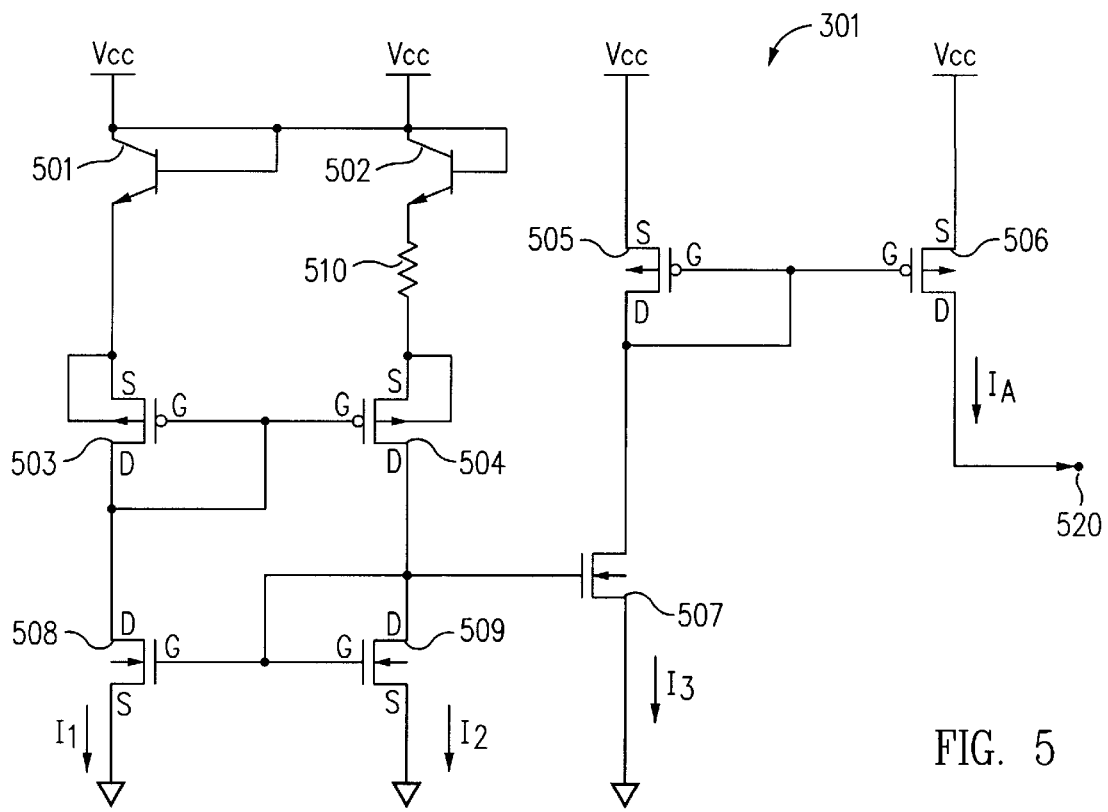
FIG. 5 is a circuit diagram of a compensating current source which generates a compensating current $I_A$ having a positive slope with respect to temperature.

FIG. 5 is a circuit diagram of compensation current source 301 in accordance with one embodiment of the present invention. Compensation current source 301 includes NPN bipolar transistors 501–502, p-channel FETs 503–506, n-channel FETs 507–509 and resistor 510. NPN bipolar transistor 501, p-channel FET 503 and n-channel FET 508 are connected in series between the $V_{CC}$ voltage supply terminal and the ground voltage supply terminal. Similarly, NPN bipolar transistor 502, resistor 510, p-channel FET 504 and n-channel FET 509 are connected in series between the $V_{CC}$ voltage supply terminal and the ground voltage supply terminal. The bases of bipolar transistors 501 and 502 are coupled to the $V_{CC}$ voltage supply terminal. The substrates of p-channel FETs 503 and 504 are coupled to their respective sources. The drain of p-channel FET 503 is coupled to the gates of p-channel FETs 503 and 504. The drain of n-channel FET 509 is coupled to the gates of n-channel transistors 507, 508 and 509. P-channel FET 505 and n-channel FET 507 are connected in series between the $V_{CC}$ voltage supply terminal and the ground voltage supply terminal. P-channel FET 506 is connected in series between the $V_{CC}$ voltage supply terminal and the output terminal 520 of compensation current source 301. The drain of p-channel FET 505 is coupled to the gates of p-channel FETs 505 and 506.

As previously described, compensation current source 301 provides a compensation current $I_A$ which has a positive slope with respect to temperature. Compensation current source 301 operates as follows. N-channel FETs 508 and 509 are identical. Because the gates of these n-channel FETs 508 and 509 are biased by the same signal, these transistors have the same gate-to-source voltages, and therefore carry the same current. The currents through n-channel FETs 508 and 509 are labeled as currents $I_1$ and $I_2$, respectively. N-channel FETs 508 and 509, being identical transistors which carry equal currents, have identical drain-to-source voltages.

P-channel FETs 503 and 504 are also identical. Because p-channel FETs 503 and 504 carry identical currents (i.e., $I_1$ and $I_2$ respectively) and the gates of p-channel FETs 503 and 504 are biased by the same signal, these transistors have the same drain-to-source voltages. As a result, the voltage at the source of p-channel FET 503 is equal to the voltage at the source of p-channel FET 504. The voltage across the base and emitter of NPN bipolar transistor 501 ($V_{BE501}$) is therefore equal to the voltage across the base and emitter of bipolar transistor 502 ($V_{BE502}$) plus the voltage drop across resistor 510 ($I_2 R$). This equation is set forth below.

$$V_{BES01}=V_{BES02}+I_2R \quad (8)$$

Equation (8) can be re-written as follows.

$$I_2=(V_{BES01}-V_{BES02})/R \quad (9)$$

The general equation for the base-to-emitter voltage of an NPN bipolar transistor is:

$$V_{BE}=KT/q \ln(J_C/AT^\gamma)+V_{GO}, \quad (10)$$

Where K is Boltzmann's constant ($1.381\times10^{-23}$ J/° K), T is the temperature of the transistor in ° K, q is the magnitude of electronic charge ($1.6\times10^{-19}$ C), $J_C$ is the collector current density in A/m², A is a temperature independent constant, γ is a temperature coefficient, and $V_{GO}$ is the bandgap voltage.

Equations (9) and (10) can be combined to form the following equation.

$$I_2=[(KT/q \ln(J_{C1}/A_1T^\gamma)+V_{GO}) -(KT/q \ln(J_{C2}/A_2T^\gamma)+V_{GO})]/R \quad (11)$$

Because the temperature independent constants A, $V_{GO}$ and γ are the same for bipolar transistors 501 and 502, the following equation is obtained.

$$I_2=[KT/q \ln(J_{C1}/J_{C2})]/R \quad (12)$$

Because current density (J) is equal to current (I) divided by area (A), equation (12) can be modified to obtain equation (13).

$$I_2=[KT/q \ln((I_1/A_{E1})/(I_2/A_{E2}))]/R \quad (13)$$

Where $A_{E1}$ and $A_{E2}$ are the emitter areas of transistors 501 and 502, respectively. Because I1=I2, equation (13) reduces to the following equation.

$$I_2=[KT/q \ln(A_{E2}/A_{E1})]/R \quad (14)$$

Taking the derivative of equation (14) with respect to temperature T results in the following equation.

$$\partial I_2/\partial T=[K/q \ln(A_{E2}/A_{E1})]/R \quad (15)$$

A positive temperature dependence is obtained (i.e., $\partial I_2/\partial T$ is positive) if $A_{E2}$ is greater than $A_{E1}$. Transistors 501 and 502 are therefore designed such that $A_{E2}$ is greater than $A_{E1}$, thereby providing a positive temperature dependence for current $I_2$. As a result, when the temperature T increases, the current $I_2$ increases. Conversely, when the temperature decreases, the current $I_2$ decreases.

In the described embodiment, n-channel FET 507 is identical to n-channel transistors 508 and 509. Because n-channel FET 507 is biased with the same signal as n-channel FETs 508 and 509, a current mirror circuit is formed. As a result, the current $I_3$ flowing through n-channel FET 507 is equal to the currents $I_1$ and $I_2$ flowing through n-channel FETs 508 and 509.

Because n-channel FET 507 is connected in series with p-channel FET 505, the current $I_3$ also flows through P-channel FET 505. P-channel FET 505 is biased by the same signal as p-channel transistor 506, thereby forming a current mirror circuit. If p-channel FET 505 were identical to p-channel FET 506, then the compensation current $I_A$ flowing through p-channel FET 506 would be equal to the current $I_3$ flowing through p-channel FET 505. However, instead of designing p-channel FET 506 to be identical to p-channel FET 505, p-channel FETs 505 and 506 are sized such that the resulting compensation current $I_A$ is weighted by the previously determined $X_A$ value.

Although the above-described example applies the $X_A$ value by selectively sizing p-channel FETs 505 and 506, it is understood that the $X_A$ value can also be applied by selectively sizing one or more of FETs 505, 506 or 507 in a manner known to one of ordinary skill in the art.

Because the current $I_2$ is translated through current mirror circuits to create the compensation current $I_A$, the compensation current $I_A$, like the current $I_2$, has a positive temperature dependence. This positive temperature dependence was previously described in connection with FIG. 4A.

Figure 6:
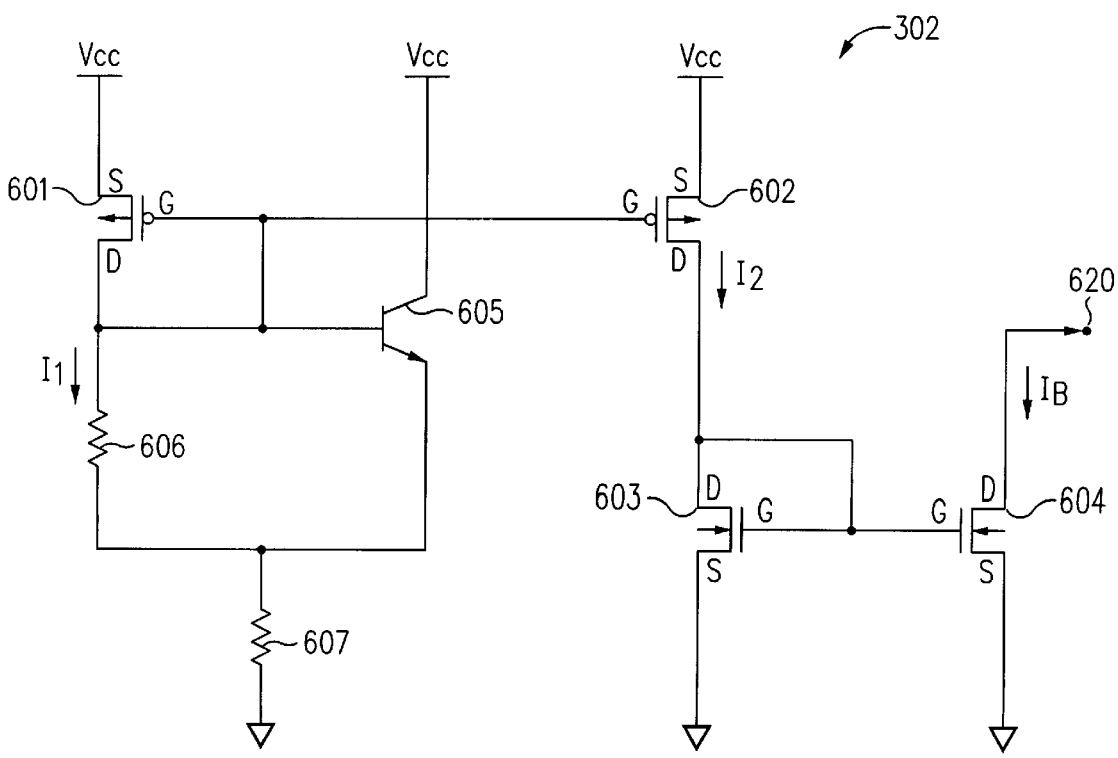
FIG. 6 is a circuit diagram of a compensating current source which generates a compensating current $I_B$ having a negative slope with respect to temperature.

FIG. 6 is a circuit diagram of compensation current source 302 in accordance with one embodiment of the present invention. Compensation current source 302 includes p-channel FETs 601–602, n-channel FETs 603–604, NPN bipolar transistor 605, and resistors 606–607. P-channel FET 601, resistor 606 and resistor 607 are connected in series between the $V_{CC}$ voltage supply terminal and the ground voltage supply terminal. NPN bipolar transistor 605 and resistor 607 are also connected in series between the $V_{CC}$ voltage supply terminal and the ground voltage supply terminal. In addition, p-channel FET 602 and n-channel FET 603 are connected in series between the $V_{CC}$ voltage supply terminal and the ground voltage supply terminal. N-channel FET 604 is connected in series between the ground voltage supply terminal and output terminal 620. The drain of p-channel FET 601 is connected to the gates of p-channel FETs 601 and 602, as well as to the base of bipolar transistor 605. The drain of n-channel FET 603 is coupled to the gates of n-channel FETs 603 and 604.

As previously described, compensation current source 302 provides a compensation current $I_B$ which has a negative slope with respect to temperature. Compensation current source 302 operates as follows.

As described in detail below, the base-emitter voltage (VBE) of bipolar transistor 605 has a negative temperature dependence. More specifically, the derivative of $V_{BE}$ with respect to temperature (at temperature $T_0$) is set forth below.

$$\partial V_{BE}/\partial T=(V_{BE}-V_{GO})/T_0+(\alpha-\gamma)(K/q) \quad (16)$$

where α is a constant smaller than γ (and the other variables were defined above in connection with compensation current source 301). The bandgap voltage $V_{GO}$ is always greater than VBE. As a result, $\partial V_{BE}/\partial T$ will always be a negative value. When $T_0$ is equal to 300° K, γ is typically equal to about 3.2 and α is typically equal to about 1. Under these conditions, $\partial V_{BE}/\partial T$ is approximately equal to −1.7 mV/° C. Consequently, $V_{BE}$ has a negative temperature dependence. Stated another way, when the temperature $T_0$ increases, the $V_{BE}$ voltage of transistor 605 decreases.

Returning now to FIG. 6, $V_{BE}$ is applied across resistor 606. The current $I_1$ through resistor 606 is therefore proportional to the $V_{BE}$ voltage. More specifically, the current $I_1$ is equal to $V_{BE}/R_{606}$, where $R_{606}$ is the resistance of resistor 606.

P-channel FETs 601 and 602 are identical, and are biased with the same signal. As a result, these FETs 601–602 form a current mirror circuit. This current mirror circuit causes the current $I_2$ through transistor 602 to be equal to the current $I_1$ through p-channel FET 601.

N-channel FETs 603 and 604 are also coupled to form a current mirror circuit. Thus, if n-channel FETs 603 and 604 were selected to be identical, the compensation current $I_B$ through n-channel FET 604 would be equal to the current $I_2$ through FETs 602 and 603. However, instead of designing n-channel FET 603 to be identical to n-channel FET 604, n-channel FETs 603 and 604 are sized such that the resulting compensation current $I_B$ is weighted by the previously determined $X_B$ value.

Although the above-described example applies the $X_B$ value by selectively sizing n-channel FETs 603 and 604, it is understood that the XB value can also be applied by selectively sizing one or more of FETs 602, 603 or 604 in a manner known to one of ordinary skill in the art.

Because the current $I_1$ is translated through current mirror circuits to create the compensation current $I_B$, the compensation current $I_B$, like the current $I_1$, has a negative temperature dependence. This negative temperature dependence was previously described in connection with FIG. 4B.

Figure 7:
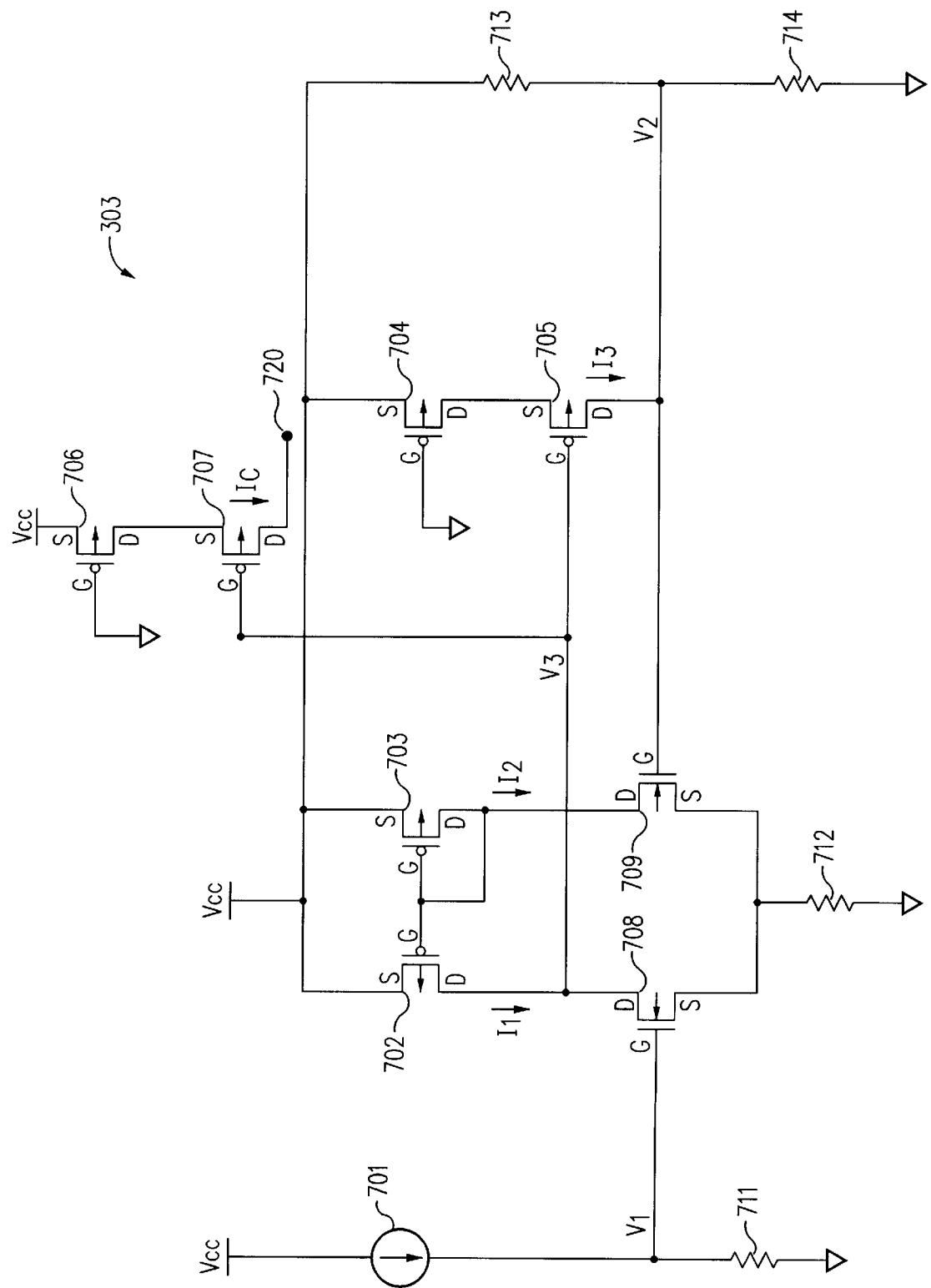
FIG. 7 is a circuit diagram of a compensating current source which generates a compensating current $I_C$ having a negative slope with respect to the $V_{CC}$ supply voltage.

FIG. 7 is a circuit diagram of compensation current source 303 in accordance with one embodiment of the present invention. Compensation current source 303 includes constant current source 701, p-channel FETs 702–707, n-channel FETs 708–709 and resistors 711–714. As previously described, compensation current source 303 provides a compensation current $I_C$ which has a negative $V_{CC}$ supply voltage slope. Compensation current source 303 operates as follows.

Constant current source 701 and resistor 711 are connected in series between the $V_{CC}$ and ground voltage supply terminals, thereby creating a fixed reference voltage $V_1$ which is applied to the gate of n-channel FET 708.

Resistors 713 and 714 are connected in series between the $V_{CC}$ and ground voltage supply terminals, thereby forming a voltage divider circuit which applies a voltage $V_2$ to the gate of n-channel FET 709. The values of resistors 713 and 714 are selected such that the voltage $V_2$ is equal to the reference voltage $V_1$ when the $V_{CC}$ supply voltage is at its specified level (i.e., 3.3 Volts). The voltage $V_2$ follows the $V_{CC}$ supply voltage. Thus, when the $V_{CC}$ supply voltage increases (or decreases), the voltage $V_2$ similarly increases (or decreases).

N-channel FETs 708–709, p-channel FETs 702–703 and resistor 712 are configured as a conventional voltage differential circuit, which is described in more detail below. P-channel FET 702, n-channel FET 708 and resistor 712 are connected in series between the $V_{CC}$ and ground supply voltages. Similarly, p-channel FET 703, n-channel FET 709 and resistor 712 are connected in series between the $V_{CC}$ and ground supply voltages. N-channel FETs 708 and 709 are identical transistors. The gates of n-channel FETs 708 and 709 form the input terminals of the differential circuit. P-channel FETs 702 and 703 are also identical transistors, which are biased by the signal provided at the drain of n-channel FET 709. Consequently, p-channel transistors 702 and 703 form a current mirror circuit within the differential circuit.

As the voltage $V_2$ increases (or decreases), the current $I_2$ through n-channel FET 709 increases (or decreases). The current mirror circuit ensures that the current $I_2$ flowing through FETs 702 and 708 is equal to the current $I_2$. As a result, the voltage $V_3$ at the drain of n-channel FET 708 follows the voltage $V_2$. More specifically, the voltage $V_3$ increases (or decreases) as the voltage $V_2$ increases (or decreases).

The drain of n-channel FET 708 is coupled to the gate of p-channel FET 705. The drain of p-channel FET 705 is coupled to the ground voltage supply terminal through resistor 714, and the source of p-channel FET 705 is coupled to the drain of p-channel FET 704. The gate of p-channel FET 704 is connected to the ground voltage supply terminal, and the source of p-channel FET 704 is coupled to the $V_{CC}$ voltage supply terminal. A current $I_3$ flows through p-channel FET 705 in response to the voltage $V_3$. As the voltage $V_3$ increases (or decreases), the compensating current $I_3$ decreases (or increases). As the current $I_3$ decreases (or increases), the voltage $V_2$ decreases (or increases). The voltage $V_2$ decreases (or increases) until the voltage $V_2$ is equal to the voltage $V_1$.

The drain of n-channel FET 708 is also coupled to the gate of p-channel FET 707. The drain of p-channel FET 707 is coupled to output terminal 720, and the source of p-channel FET 707 is coupled to the drain of p-channel FET 706. The gate of p-channel FET 706 is connected to the ground voltage supply terminal, and the source of p-channel FET 706 is coupled to the $V_{CC}$ voltage supply terminal. The compensation current $I_C$ flows through p-channel FET 707 in response to the voltage $V_3$.

P-channel FETs 704–707 form a current mirror circuit. In the described embodiment, p-channel FET 704 is identical to p-channel FET 706. If p-channel FETs 705 and 707 were identical, then the compensation current $I_C$ would be equal to the current $I_3$. However, instead of designing p-channel FET 705 to be identical to p-channel FET 707, p-channel FETs 704–705 and 706–707 are sized such that the resulting compensation current $I_C$ is weighted by the previously determined $X_C$ value.

Although the above-described example applies the $X_C$ value by selectively sizing p-channel FETs 705 and 707, it is understood that the $X_c$ value can also be applied by selectively sizing one or more of FETs 704–707 in a manner known to one of ordinary skill in the art.

To summarize, when the $V_{CC}$ supply voltage decreases, the compensation current $I_C$ increases. Conversely, when the $V_{CC}$ supply voltage increases, the compensation current $I_c$ decreases. Thus, the compensation current $I_C$ has a negative slope with respect to the $V_{CC}$ supply voltage. This relationship was described above in connection with FIG. 4C.

Figure 8:
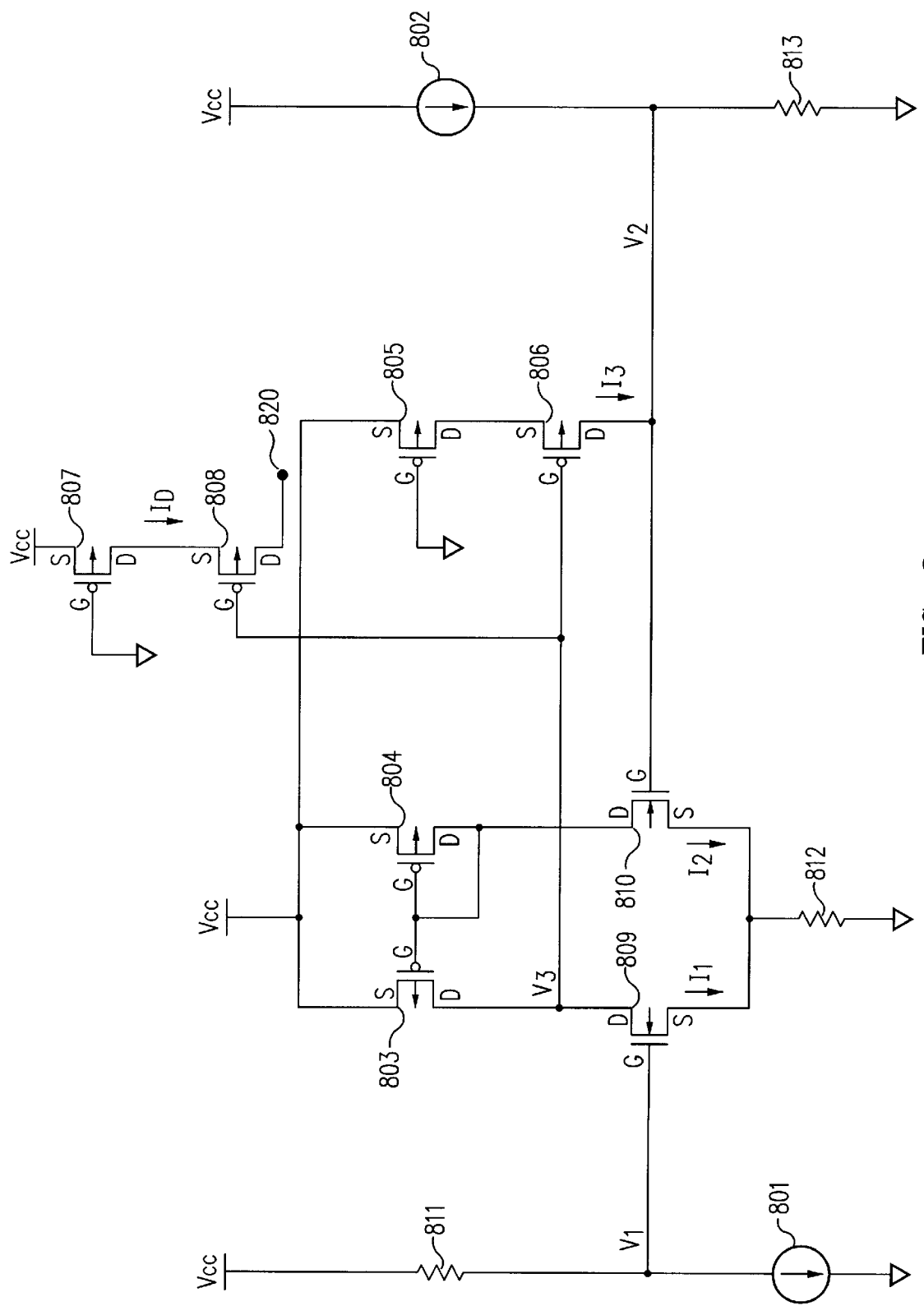
FIG. 8 is a circuit diagram of a compensating current source which generates a compensating current $I_D$ having a positive slope with respect to the $V_{CC}$ supply voltage.

FIG. 8 is a circuit diagram of compensation current source 304 in accordance with one embodiment of the present invention. Compensation current source 304 includes constant current sources 801–802, p-channel FETs 803–808, n-channel FETs 809–810 and resistors 811–813. As previously described, compensation current source 304 provides a compensation current $I_D$ which has a positive slope with respect to the $V_{CC}$ supply voltage. Compensation current source 304 operates as follows.

P-channel FETs 803–804, n-channel FETs 809–810 and resistor 812 are connected in the same manner as p-channel FETs 702–703, n-channel FETs 708–709 and resistor 712 (FIG. 7) to form a voltage differential circuit. Similarly, p-channel FETs 805–808 are connected in the same manner as p-channel FETs 704–707 (FIG. 7) to form a current mirror circuit.

Constant current source 802 and resistor 813 are connected in series between the $V_{CC}$ and ground voltage supply terminals, thereby creating a voltage $V_2$ which is applied to the gate of n-channel FET 810. Resistor 811 and constant current source 801 are connected in series between the $V_{CC}$ and ground voltage supply terminals as illustrated, thereby providing a voltage $V_1$ to the gate of n-channel FET 809. The voltage $V_1$ follows the $V_{CC}$ supply voltage. Thus, when the $V_{CC}$ supply voltage increases (or decreases), the voltage $V_1$ increases (or decreases).

When the voltage $V_1$ increases (or decreases), the drain-to-source resistance of n-channel FET 809 decreases (or increases). However, the current mirror formed by p-channel FETs 803–804 and n-channel FET 810 causes the current $I_1$ through n-channel FET 809 to remain unchanged. As a result, the voltage $V_3$ at the drain of transistor 809 decreases (or increases). This decrease (or increase) in voltage $V_3$, in turn, causes an increase (or increase) in the current $I_3$ and the compensation current $I_D$. The increase (or decrease) in the current $I_3$ causes the voltage $V_2$ to increase (or decrease). The voltage $V_2$ increases (or decreases) until the voltage $V_2$ is equal to the voltage $V_1$.

The $X_D$ value is applied by selectively sizing p-channel FETs 806 and 808 in the manner described above for compensation current source 303.

To summarize, when the $V_{CC}$ supply voltage increases, the compensation current $I_D$ increases. Conversely, when the $V_{CC}$ supply voltage decreases, the compensation current $I_D$ decreases. Thus, the compensation current $I_D$ has a positive slope with respect to the $V_{CC}$ supply voltage. This positive $V_{CC}$ voltage supply dependence was described above in connection with FIG. 4D.

Figure 9:
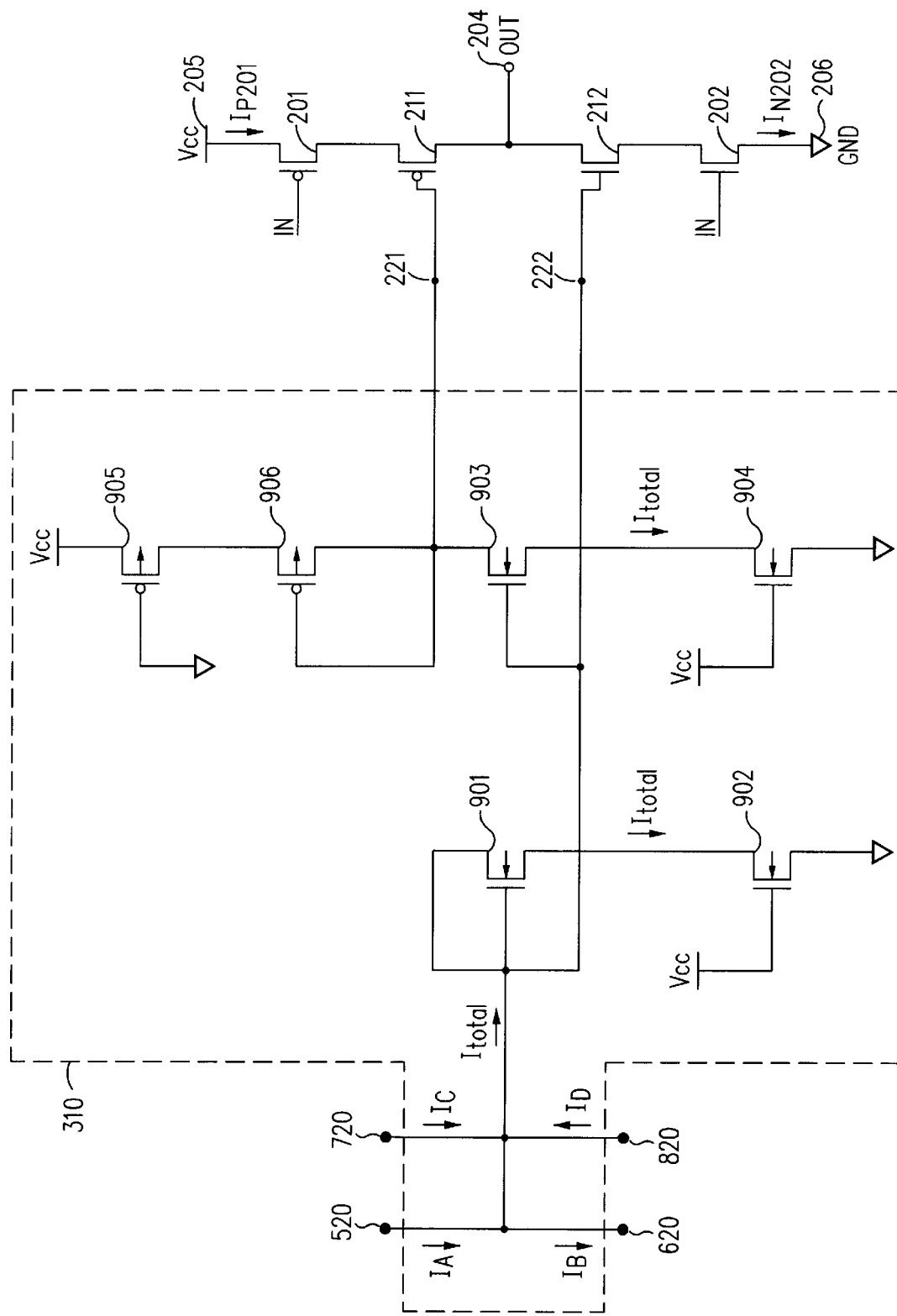
FIG. 9 is a circuit diagram of a summing circuit which combines the compensating currents $I_A$, $I_B$, $I_C$ and $I_D$ in accordance with one embodiment of the present invention.

FIG. 9 is a circuit diagram of summing circuit 310, along with p-channel FETs 201, 211 and n-channel FETs 202, 212 of compensated inverter circuit 200. Summing circuit 310 includes n-channel transistors 901–904 and p-channel transistors 905–906. Compensating currents $I_A$, $I_B$, $I_C$ and $I_D$ are summed to create the compensation current $I_{target}$. Compensation current $I_{target}$ is applied to the gate and the drain of n-channel FET 901. As a result, the total compensation current $I_{target}$ is routed through n-channel FETs 901 and 902. Note that the gate of n-channel FET 902 is connected to the $V_{CC}$ supply voltage terminal, thereby turning on FET 902.

P-channel FETs 905–906 and n-channel FETs 903–904 are connected in series between the $V_{CC}$ voltage supply terminal and the ground voltage supply terminal as illustrated. The gate of p-channel transistor 905 is coupled to the ground supply voltage terminal, thereby turning on this FET 905. Similarly, the gate of n-channel FET 904 is coupled to the $V_{CC}$ voltage supply terminal, thereby turning on this FET 904. The gate of n-channel FET 903 is connected to the gate of n-channel FET 901. N-channel FETs 901 and 903 are identical. Similarly, n-channel FETs 902 and 904 are identical. As a result, FETs 901–904 form a current mirror circuit. The compensation current $I_{target}$ therefore flows through series-connected FETs 903–906.

P-channel FETs 201 and 211 are designed to be identical to p-channel FETs 905 and 906, respectively. Similarly, n-channel FETs 212 and 202 are designed to be identical to n-channel FETs 903 and 904, respectively. The gate of n-channel FET 212 is coupled to the gates of n-channel FETs 901 and 903. The gate of p-channel FET 211 is coupled to the gate (and drain) of p-channel FET 906.

The IN signal applied to FETs 201 and 202 can have either a logic high value or a logic low value. If the IN signal has a logic high value (i.e., $V_{CC}$), n-channel FET 202 is turned on and p-channel FET 201 is turned off. As a result, n-channel FETs 903, 904, 212 and 202 form a current mirror circuit, and the compensation current $I_{target}$ flows from the output terminal 204 to the ground voltage supply terminal 206 through n-channel FETs 202 and 212.

If the IN signal has a logic low value (i.e., 0 Volts), p-channel FET 201 is turned on and n-channel FET 202 is turned off. As a result, p-channel FETs 905, 906, 201 and 211 form a current mirror circuit, and the compensation current $I_{target}$ flows from the $V_{CC}$ voltage supply terminal 205 to the output terminal 204 through p-channel FETs 201 and 211. In the foregoing manner, the compensation current $I_{target}$ is translated to the output terminal 204 of compensated inverter 200.

Figure 10:
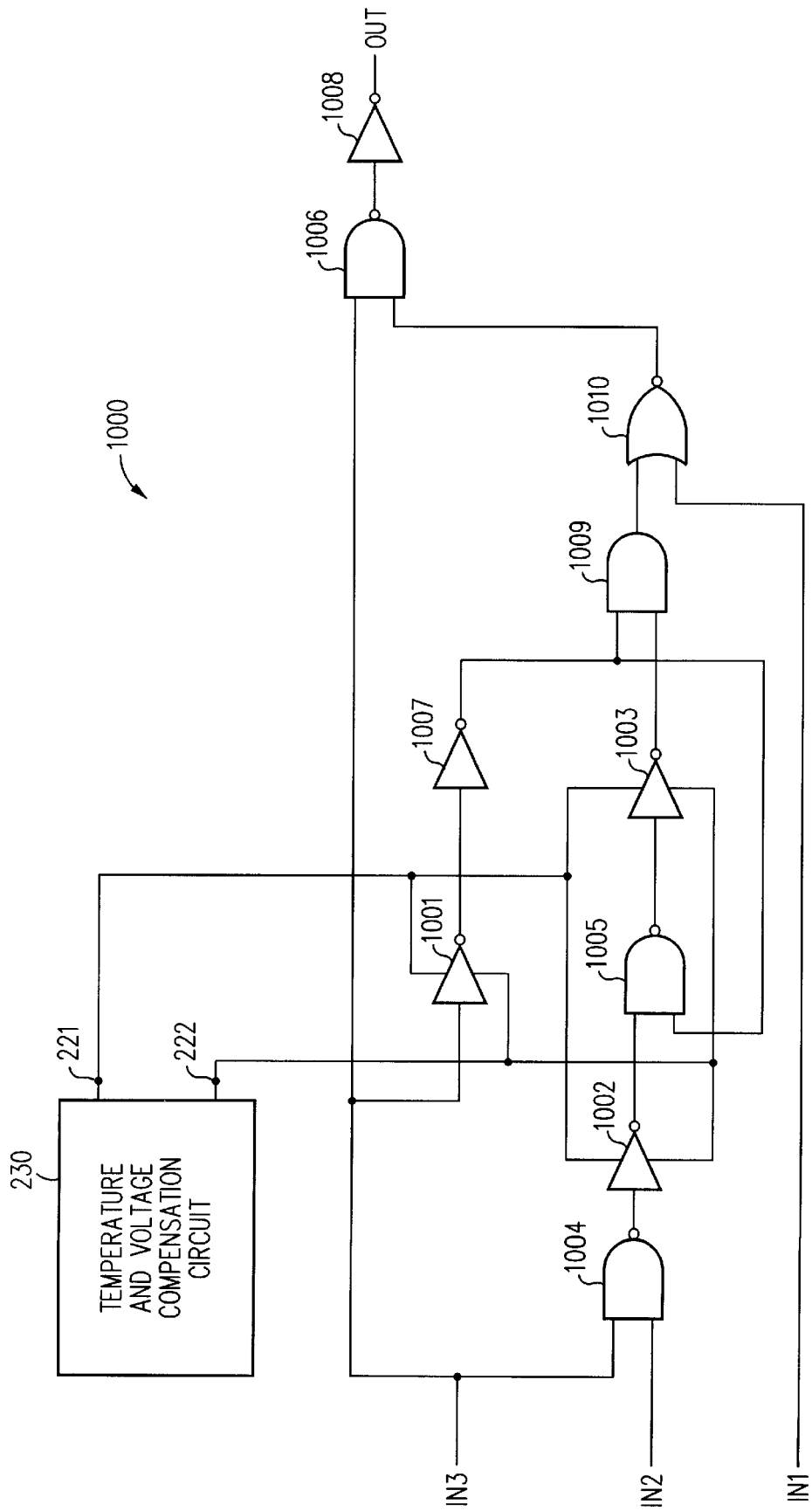
FIG. 10 is a circuit diagram of a clock delay chain circuit which includes compensated circuit elements and non-compensated circuit elements in accordance with another embodiment of the present invention.

FIG. 10 is a circuit diagram of a clock delay chain circuit 1000 in accordance with another embodiment of the present invention. Clock delay chain circuit 1000 includes temperature and voltage compensation circuit 230, compensated inverter circuits 1001–1003, NAND gates 1004–1006, inverters 1007–1008, AND gate 1009 and NOR gate 1010. Compensation circuit 230 has been described in detail above. Each of compensated inverter circuits 1001–1003 is identical to the above-described compensated inverter circuit 200. NAND gates 1004–1006, inverters 1007–1008, AND gate 1009 and NOR gate 1010 are non-compensated circuit elements.

In general, clock delay chain circuit 1000 operates as follows. The input signal INI is given a logic "0" value and the input signal IN3 is given a logic "1" value. The input signal IN2 is an input clock signal, which is propagated through clock delay chain circuit 1000 to create an output clock signal OUT. The various logic gates 1001–1010 are connected for form a delay chain. The characteristics of this delay chain can be modified by controlling the compensation currents provided to compensated inverter circuits 1001–1003. The control of these compensation currents was described above in connection with compensated inverter circuit 200. For example, by controlling the compensation currents provided to compensated inverter circuits 1001–1003, the circuit designer can provide a clock delay chain circuit having a constant speed, or alternatively, a constant pulse width. In this manner, compensated circuit elements can be used in the same circuits as non-compensated circuit elements, with the compensated circuit elements providing control to the larger circuit.

Although the present invention has been described in connection with several embodiments, it is understood that this invention is not limited to the embodiments disclosed, but is capable of various modifications which would be apparent to one of ordinary skill in the art. Thus, the invention is limited only by the following claims.

We claim:

1. A circuit comprising:
   a first compensation current circuit for generating a first compensation current which has a positive slope with respect to temperature;
   a second compensation current circuit for generating a second compensation current which has negative slope with respect to temperature;
   a third compensation current circuit for generating a third compensation current which has a negative slope with respect to a supply voltage;
   a fourth compensation current circuit for generating a fourth compensation current which has a positive slope with respect to the supply voltage; and
   a summing circuit for summing the first, second, third and fourth compensation currents to create a total compensation current, and for translating the total compensation current to a circuit to be compensated.

2. The circuit of claim 1, further comprising means for weighting the first, second, third and fourth compensation currents.

3. The circuit of claim 1, wherein the circuit to be compensated comprises an inverter.

4. The circuit of claim 1, wherein the first compensation current circuit comprises:
   a first bipolar transistor having a base-emitter junction and an emitter with a first area;
   a second bipolar transistor having a base-emitter junction and an emitter with a second area, the second area being greater than the first area;
   a resistor connected in series with the base-emitter junction of the second bipolar transistor; and
   a circuit for biasing the base-emitter junction of the first bipolar transistor at the same voltage as the base-emitter junction of the second bipolar transistor and the resistor.

5. The circuit of claim 1, wherein the second compensation current source comprises:

a bipolar transistor having a base-emitter junction; and a resistor connected in parallel with the base-emitter junction of the bipolar transistor, wherein a current through the resistor is used to generate the second compensation current.

6. The circuit of claim 1, wherein the third compensation current source comprises:

a voltage differential circuit having an input terminal coupled to receive the supply voltage, the voltage differential circuit generating a control voltage which follows the supply voltage; and a current mirror circuit which is controlled by the control voltage.

7. The circuit of claim 1, wherein the fourth compensation current source comprises:

a voltage differential circuit having an input terminal coupled to receive the supply voltage, the voltage differential circuit generating a control voltage which is inversely proportional to the supply voltage; and a current mirror circuit which is controlled by the control voltage.

8. The circuit of claim 1, wherein one or more of the compensation current sources comprises a current mirror circuit which is designed to adjust the associated compensation currents.

9. The circuit of claim 1, wherein the summing circuit comprises a first current mirror circuit.

10. The circuit of claim 9, wherein the compensated circuit forms a second current mirror circuit.

11. The circuit of claim 1, wherein the circuit to be compensated comprises elements that are compensated by the total compensation current and elements that are not compensated by the total compensation current.

12. A method of providing current compensation for a circuit, the method comprising the steps of:

generating a first compensation current which has a positive slope with respect to temperature;

generating a second compensation current which has a negative slope with respect to temperature;

generating a third compensation current which has a negative slope with respect to a supply voltage;

generating a fourth compensation current which has a positive slope with respect to the supply voltage;

summing the first, second, third and fourth compensation currents to create a total compensation current; and translating the total compensation current to the circuit.

13. The method of claim 12, wherein the step of translating further comprises the step of using a current mirror circuit to provide the total compensation current to the circuit.

14. The method of claim 12, further comprising the steps of:

selecting a plurality of total compensation currents for a corresponding plurality of operating conditions; and then weighting the first, second, third and fourth compensation currents to provide the plurality of total compensation currents for the corresponding plurality of operating conditions.

15. The method of claim 12, wherein the step of generating the first compensation current comprises the steps of:

applying a first voltage across a base-emitter junction of a first bipolar transistor, wherein the first bipolar transistor has an emitter with a first area;

applying the first voltage across the base emitter junction of a second bipolar transistor and a resistor, wherein the second bipolar transistor has an emitter with a second area, the second area being greater than the first area; and generating the first compensation current in response to a current flowing through the resistor.

16. The method of claim 12, wherein the step of generating the second compensation current comprises the steps of:

biasing a base-emitter junction of a bipolar transistor;

connecting a resistor in parallel with the base-emitter junction of the bipolar transistor; and generating the second compensation current in response to a current flowing through the resistor.

17. The method of claim 12, wherein the step of generating the third compensation current comprises the steps of:

applying a voltage representative of the supply voltage to a voltage differential circuit;

generating a control voltage with the voltage differential circuit, wherein the control voltage follows the supply voltage; and generating the third compensation current in response to the control voltage.

18. The method of claim 12, wherein the step of generating the fourth compensation current comprises the steps of:

applying a voltage representative of the supply voltage to a voltage differential circuit;

generating a control voltage with the voltage differential circuit, wherein the control voltage is inversely proportional to the supply voltage; and generating the fourth compensation current in response to the control voltage.

19. The method of claim 12, wherein the step of translating the total compensation current to the circuit comprises the step of providing the total compensation current to a first set of elements of the circuit, but not to a second set of elements of the circuit.

* * * * *